US012652933B2

(12) United States Patent
Jeong

(10) Patent No.: US 12,652,933 B2
(45) Date of Patent: Jun. 9, 2026

(54) DISPLAY PANEL AND DISPLAY DEVICE HAVING CRACK DAMS DISPOSED AROUND AN OPENING

(71) Applicant: Samsung Display Co., Ltd., Yongin-si (KR)

(72) Inventor: Yelin Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 560 days.

(21) Appl. No.: 18/124,728

(22) Filed: Mar. 22, 2023

(65) Prior Publication Data

US 2023/0389398 A1     Nov. 30, 2023

(30) Foreign Application Priority Data

May 25, 2022     (KR) ........................ 10-2022-0064255

(51) Int. Cl.
H10K 59/80     (2023.01)
H10K 59/12     (2023.01)
(52) U.S. Cl.
CPC ........... H10K 59/873 (2023.02); H10K 59/12 (2023.02)
(58) Field of Classification Search
CPC .................................................. H10K 59/873
See application file for complete search history.

(56) References Cited

U.S. PATENT DOCUMENTS

| | | | | |
|---|---|---|---|---|
| 10,886,346 | B2 | 1/2021 | Kim | |
| 2020/0127231 | A1* | 4/2020 | Yun | H10K 59/124 |
| 2021/0265594 | A1 | 8/2021 | Wan et al. | |
| 2021/0328184 | A1 | 10/2021 | Jung et al. | |
| 2022/0069054 | A1* | 3/2022 | Zhang | H10K 50/84 |
| 2022/0102678 | A1 | 3/2022 | Kim et al. | |
| 2023/0329070 | A1* | 10/2023 | Long | H10K 59/124 |
| | | | | 257/40 |
| 2024/0172528 | A1* | 5/2024 | Li | H10K 59/8731 |

FOREIGN PATENT DOCUMENTS

| | | |
|---|---|---|
| CN | 111969028 | 11/2020 |
| KR | 10-0703493 | 4/2007 |
| KR | 10-2019-0084192 | 7/2019 |
| KR | 10-2021-0130329 | 11/2021 |
| KR | 10-2022-0044061 | 4/2022 |

* cited by examiner

*Primary Examiner* — Michael Jung
(74) *Attorney, Agent, or Firm* — F. CHAU & ASSOCIATES, LLC

(57)     ABSTRACT

A display panel includes an opening area, a display area surrounding at least a part of the opening area, an intermediate area between the opening area and the display area, a light-emitting diode disposed on a substrate in the display area and including a first electrode, a second electrode, and a functional layer between the first electrode and the second electrode a first dam disposed in the intermediate area, a first crack dam located between the first dam and the opening area, and a second crack dam located between the first crack dam and the opening area, wherein the functional layer extends from the display area to the intermediate area, and the functional layer includes a first opening located between the first dam and the first crack dam.

20 Claims, 8 Drawing Sheets

DISPLAY PANEL AND DISPLAY DEVICE HAVING CRACK DAMS DISPOSED AROUND AN OPENING

CROSS-REFERENCE TO RELATED APPLICATION

This application claims priority to and benefits of Korean Patent Application No. 10-2022-0064255 under 35 U.S.C. § 119, filed on May 25, 2022, in the Korean Intellectual Property Office (KIPO), the entire contents of which are incorporated herein by reference.

BACKGROUND

1. Technical Field

One or more embodiments relate to a display panel and a display device including the same.

2. Description of the Related Art

Recently, the purposes of display devices have diversified. In addition, the thicknesses and weights of display devices are decreasing, and thus the range of uses of display devices is widening.

Studies are being conducted on a display device, in which various components may be arranged in a display area, to add various functions while increasing the area occupied by the display area within the display device.

SUMMARY

One or more embodiments include a display panel including an opening area for arranging various types of components in a display area, and a display device including the display panel. However, this is merely an example, and the scope of the disclosure is not limited by the above effects.

Additional aspects will be set forth in part in the description which follows and, in part, will be apparent from the description, or may be learned by practice of the presented embodiments of the disclosure.

According to one or more embodiments, a display panel includes an opening area, a display area surrounding at least a part of the opening area, an intermediate area between the opening area and the display area, a light-emitting diode disposed on a substrate in the display area and including a first electrode, a second electrode, and a functional layer between the first electrode and the second electrode, a first dam disposed in the intermediate area, a first crack dam located between the first dam and the opening area, and a second crack dam located between the first crack dam and the opening area. The functional layer extends from the display area to the intermediate area, and the functional layer includes a first opening located between the first dam and the first crack dam.

The display panel may further include an inorganic insulating layer disposed on the substrate. The inorganic insulating layer may include at least one groove, and the first crack dam fills the at least one groove included in the inorganic insulating layer.

The second crack dam may fill the at least one groove included in the inorganic insulating layer.

The display panel may further include a third crack dam located between the second crack dam and the opening area.

The display panel may further include a second dam located between the first dam and the display area.

The functional layer may include a second opening located between the first dam and the second dam, and a third opening located between the display area and the second dam.

The display panel may further include a metal layer overlapping at least one of the first dam or the second dam in a plan view.

The metal layer may at least partially overlap a top surface of the first dam, a first side surface of the first dam adjacent to the second dam, and a second side surface of the first dam adjacent to the opening area in a plan view, and the metal layer may at least partially overlap a top surface of the second dam, and a side surface of the second dam adjacent to the first dam in a plan view.

The metal layer may include an opening overlapping the top surface of the first dam in a plan view.

The metal layer may further include a first metal layer and a second metal layer. The first metal layer and the second metal layer may at least partially overlap each other in a plan view.

The display panel may further include a planarization layer disposed on the metal layer.

The display panel may further include a crack detection layer located between the display area and the second dam.

The planarization layer may cover the crack detection layer.

According to one or more embodiments, a display panel includes an opening area, a display area surrounding at least a part of the opening area, an intermediate area between the opening area and the display area, a plurality of dams disposed on a substrate in the intermediate area, a plurality of crack dams located between the plurality of dams and the opening area, and a metal layer at least partially overlapping the plurality of dams in a plan view.

The plurality of crack dams may include a first crack dam located between the display area and the opening area, and a second crack dam located between the first crack dam and the opening area, and the plurality of dams may include a first dam located between the display area and the first crack dam, and a second dam located between the display area and the first dam.

The display panel may further include an inorganic insulating layer disposed on the substrate. The inorganic insulating layer may include at least one groove, and the first crack dam may fill the at least one groove included in the inorganic insulating layer.

The second crack dam may fill the at least one groove included in the inorganic insulating layer.

The plurality of crack dams may include a third crack dam located between the second crack dam and the opening area.

The display panel may further include a light-emitting diode disposed in the display area and including a first electrode, a second electrode, and a functional layer between the first electrode and the second electrode. The functional layer may extend from the display area to the intermediate area, and the functional layer may include a first opening located between the first dam and the first crack dam.

According to one or more embodiments, a display device includes a display panel including an opening area, a display area surrounding at least a part of the opening area, and an intermediate area between the opening area and the display area, and a component disposed on a bottom surface of the display panel and at least partially overlapping the opening area in a plan view. The display panel may comprise a plurality of dams disposed in the intermediate area, a plurality of crack dams located between the plurality of dams and the opening area, and a metal layer at least partially overlapping the plurality of dams.

Other aspects, features, and advantages other than those described above will become apparent from the detailed descriptions, claims and drawings for carrying out the following disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
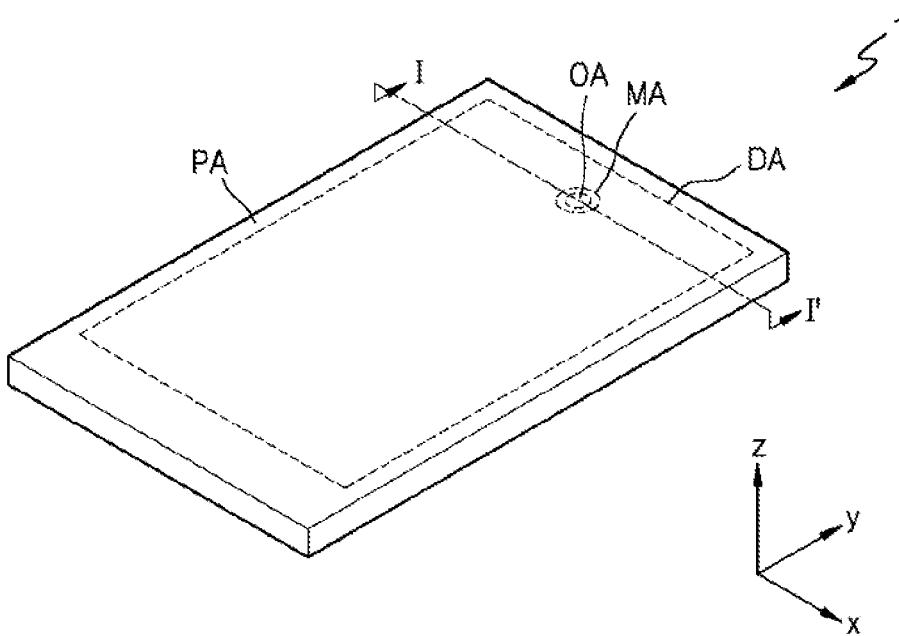
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

The disclosure may have various modifications and various embodiments, and specific embodiments are illustrated in the drawings and are described in detail in the detailed description. Effects and features of the disclosure and methods of achieving the same will become apparent with reference to embodiments described in detail with reference to the drawings. However, the disclosure is not limited to the embodiments described below, and may be implemented in various forms.

Hereinafter, embodiments will be described in detail with reference to the accompanying drawings, and in the following description with reference to the drawings, like reference numerals refer to like elements and redundant descriptions thereof will be omitted.

In the following embodiments, the terms "first" and "second" are not used in a limited sense and are used to distinguish one component from another component.

In the following embodiments, an expression used in the singular encompasses the expression of the plural, unless it has a clearly different meaning in the context.

In the following embodiments, it will be further understood that the terms "comprise," "include," and/or their variants used herein specify the presence of stated features or components, but do not preclude the presence or addition of one or more other features or components.

It will be understood that when a layer, region, or element is referred to as being "formed on" another layer, area, or element, it can be formed directly or indirectly on the other layer, region, or element. That is, for example, intervening layers, regions, or elements may be present.

In the drawings, for convenience of description, sizes of components may be exaggerated or reduced. In other words, because sizes and thicknesses of components in the drawings are arbitrarily illustrated for convenience of explanation, the disclosure is not necessarily limited thereto.

When a certain embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

An x-axis, a y-axis, and a z-axis are not limited to three axes on an orthogonal coordinate system, but may be interpreted in a broad sense including the three axes. For example, the x-axis, the y-axis, and the z-axis may be perpendicular to one another, or may represent different directions that are not perpendicular to one another.

In the following embodiments, "on a plane" (or "in a plan view") denotes that a target portion is viewed from above and "on a cross section" (or "in a cross-sectional view") means that a vertically cut cross section of a target portion is viewed from side. In the following embodiments, "overlapping" denotes overlapping "on a plane" and "on a cross section."

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a perspective view schematically illustrating a display device 1 according to an embodiment.

Referring to FIG. 1, the display device 1 is a device configured to display a moving image or a still image, and may be used not only as a portable display device, such as a mobile phone, a smartphone, a tablet personal computer (PC), a mobile communication terminal, an electronic notebook, an e-book reader, a portable multimedia player (PMP), a navigation device, or an ultra-mobile PC (UMPC), but also as a display screen of any one of various products, such as a television, a laptop computer, a monitor, a billboard, and an Internet of things (IoT) device. Also, the display device 1 according to an embodiment may be used for a wearable device, such as a smartwatch, a watch phone, a glasses-type display, or a head-mounted display (HMD). The display device 1 may be used as a dashboard of a vehicle, a center information display (CID) arranged on a center fascia or dashboard of a vehicle, a rear-view mirror display replacing a side-view mirror of a vehicle, or a display arranged on a rear surface of a front seat, as an entertainment device for a back seat of a vehicle. FIG. 1 illustrates that the display device 1 according to an embodiment is used as a smartphone, for convenience of descriptions.

The display device 1 may have a rectangular shape in a plan view. For example, the display device 1 may have a rectangular planar shape having short sides in a first direction (for example, an x-direction) and long sides in a second direction (for example, a y-direction), as shown in FIG. 1. A corner where the short side in the x-direction and the long side in the y-direction meet each other may be formed round or formed at a right angle to have a curvature (e.g., a predetermined or selectable curvature). A planar shape of the display device 1 is not limited to a rectangle, and may be a polygon, an oval, or an atypical shape.

According to an embodiment, the display device 1 may include an opening area OA (for example, a first area) and a display area DA (for example, a second area) surrounding at least the opening area OA. The display device 1 may further include an intermediate area MA (for example, a third area) between the opening area OA and the display area DA, and an outer side of the display area DA, for example, a peripheral area PA (for example, a fourth area) surrounding the display area DA. The intermediate area MA may have a closed-loop shape entirely surrounding the opening area OA in a plan view.

The opening area OA may be located inside the display area DA. According to an embodiment, the opening area OA may be arranged at an upper center of the display area DA, as shown in FIG. 1. As another example, the opening area OA may be arranged at least one of various locations, such as an upper left side of the display area DA or at an upper right side of the display area DA. FIG. 1 illustrates that an opening area OA is provided, but the embodiments are not limited thereto. For example, there may be a plurality of opening areas OA.

Figure 2:
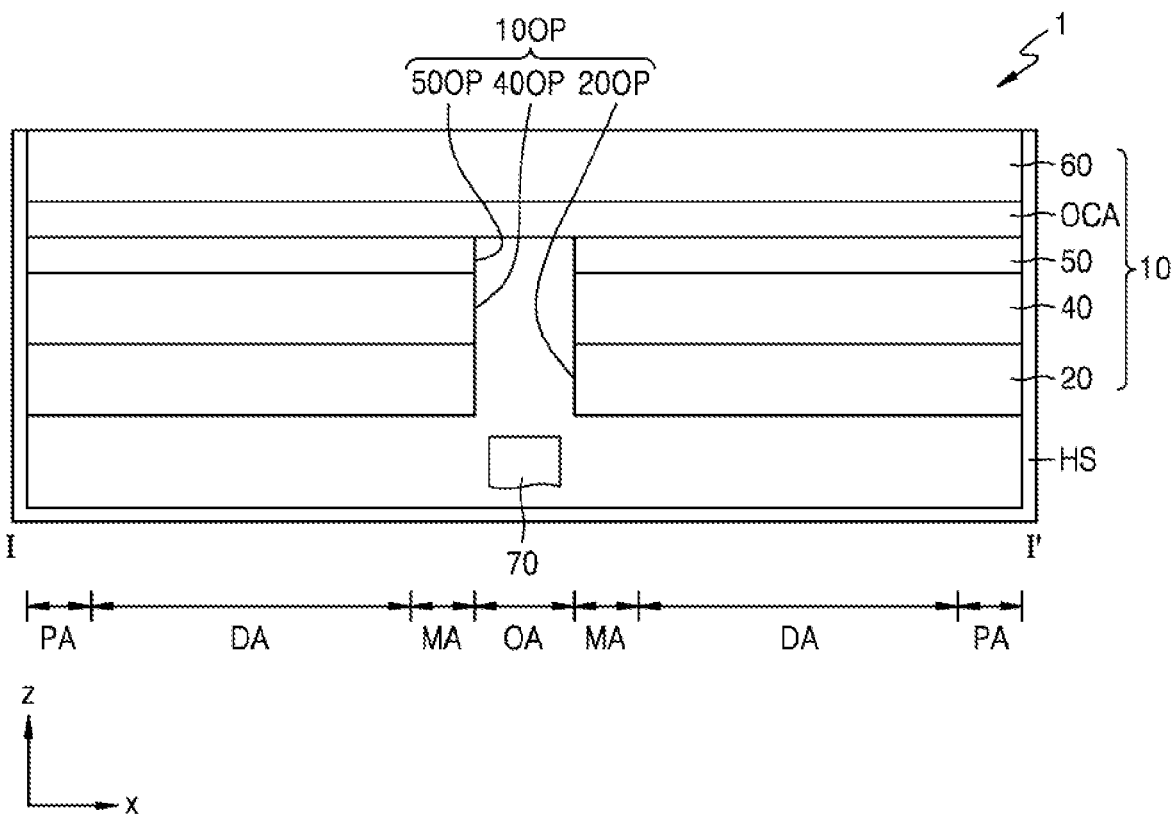
FIG. 2 is a cross-sectional view schematically illustrating a display device according to an embodiment.

FIG. 2 is a cross-sectional view schematically illustrating the display device 1 taken along line I-I' of FIG. 1, according to an embodiment.

Referring to FIG. 2, the display device 1 may include a display panel 10 and a component 70. According to an embodiment, the component 70 may be arranged at a lower portion (or below) of the display panel 10, and the component 70 may at least partially overlap the opening area OA. The display panel 10 and the component 70 may be accommodated in a housing HS.

The display panel 10 may include an image generation layer 20, an input detection layer 40, an optical functional layer 50, and a cover window 60.

The image generation layer 20 may include a display element (or a light-emitting element) configured to emit light to display an image. The display element may include a light-emitting diode, for example, an organic light-emitting diode including an organic emission layer. According to an embodiment, the light-emitting diode may be an inorganic light-emitting diode including an inorganic material. The inorganic light-emitting diode may include a PN diode including inorganic semiconductor-based materials. In case that a voltage is applied to a PN junction diode in a forward direction, holes and electrons are injected, and energy generated by recombination of the holes and electrons is converted into light energy, thereby emitting light of a certain color. The inorganic light-emitting diode may have a width of several to hundreds of micrometers or several to hundreds of nanometers. However, the embodiments are not limited thereto. According to an embodiment, the image generation layer 20 may include a quantum dot light-emitting diode. For example, an emission layer of the image generation layer 20 may include an organic material, include an inorganic material, include a quantum dot, include an organic material and a quantum dot, or include an inorganic material and a quantum dot.

The input detection layer 40 may obtain coordinate information according to external pressure, for example, a touch event. The input detection layer 40 may include a sensing electrode (or a touch electrode) and trace lines electrically connected to the sensing electrode. The input detection layer 40 may be disposed on the image generation layer 20. The input detection layer 40 may detect an external input via a mutual cap method and/or a self-cap method.

The input detection layer 40 may be formed directly on the image generation layer 20, or the image generation layer 20 and the input detection layer 40 may be separately formed and combined through an adhesive layer, such as an optically clear adhesive. For example, the input detection layer 40 may be continuously formed after a process of forming the image generation layer 20, and the adhesive layer may not be arranged between the input detection layer 40 and the image generation layer 20. FIG. 2 illustrates that the input detection layer 40 is arranged between the image generation layer 20 and the optical functional layer 50, but the input detection layer 40 may be disposed on the optical functional layer 50.

The optical functional layer 50 may include an antireflection layer. The antireflection layer may reduce reflectance of light (external light) incident from the outside towards the display panel 10 through the cover window 60. The antireflection layer may include a retarder and a polarizer. According to an embodiment, the antireflection layer may include a black matrix and color filters. The color filters may be arranged considering colors of lights respectively emitted from the light-emitting diodes of the image generation layer 20. According to an embodiment, the optical functional layer 50 may have a thickness of about 100 um.

The display panel 10 may include an opening 10OP penetrating some of layers configuring the display panel 10, so as to improve transmissivity of the opening area OA. The opening 10OP may include openings 20OP, 40OP, and 50OP respectively penetrating the image generation layer 20, input detection layer 40, and optical functional layer 50. The opening 20OP of the image generation layer 20, the opening 40OP of the input detection layer 40, and the opening 50OP of the optical functional layer 50 may overlap each other to form the opening 10OP of the display panel 10.

The cover window 60 may be disposed on the optical functional layer 50. The cover window 60 may be combined to the optical functional layer 50 through an adhesive, such as an optically clear adhesive OCA, located therebetween. The cover window 60 may cover (or overlap in a view or direction) the opening 20OP of the image generation layer 20, the opening 40OP of the input detection layer 40, and the opening 50OP of the optical functional layer 50. Although not illustrated, an opening may also be formed in the optically clear adhesive OCA and/or the cover window 60. According to an embodiment, the optically clear adhesive OCA may have a thickness of about 100 um, and the cover window 60 may have a thickness of about 660 um.

The cover window 60 may include a glass material or a plastic material. The glass material may include ultra-thin glass. The plastic material may include polyether sulfone, polyacrylate, polyether imide, polyethylene naphthalate, polyethylene terephthalate, polyphenylene sulfide, polyarylate, polyimide, polycarbonate, or cellulose acetate propionate.

The opening area OA may be a type of component area (for example, a sensor area, a camera area, or a speaker area) where the component 70 for adding various functions to the display device 1 is located.

The component 70 may include an electronic element. For example, the component 70 may be an electronic element using light or sound. For example, the electronic element may include a sensor using light, such as an infrared sensor, a camera capturing an image by receiving light, a sensor measuring a distance by outputting and detecting light or sound, or recognizing a fingerprint, a small lamp outputting light, or a speaker outputting sound. The electronic element using light may use light of various wavelength bands, such as visible light, infrared light, or ultraviolet light. The opening area OA may correspond to an area through which light and/or sound output from the component 70 to the outside or proceeding from the outside towards the electronic component may penetrate.

Figure 3:
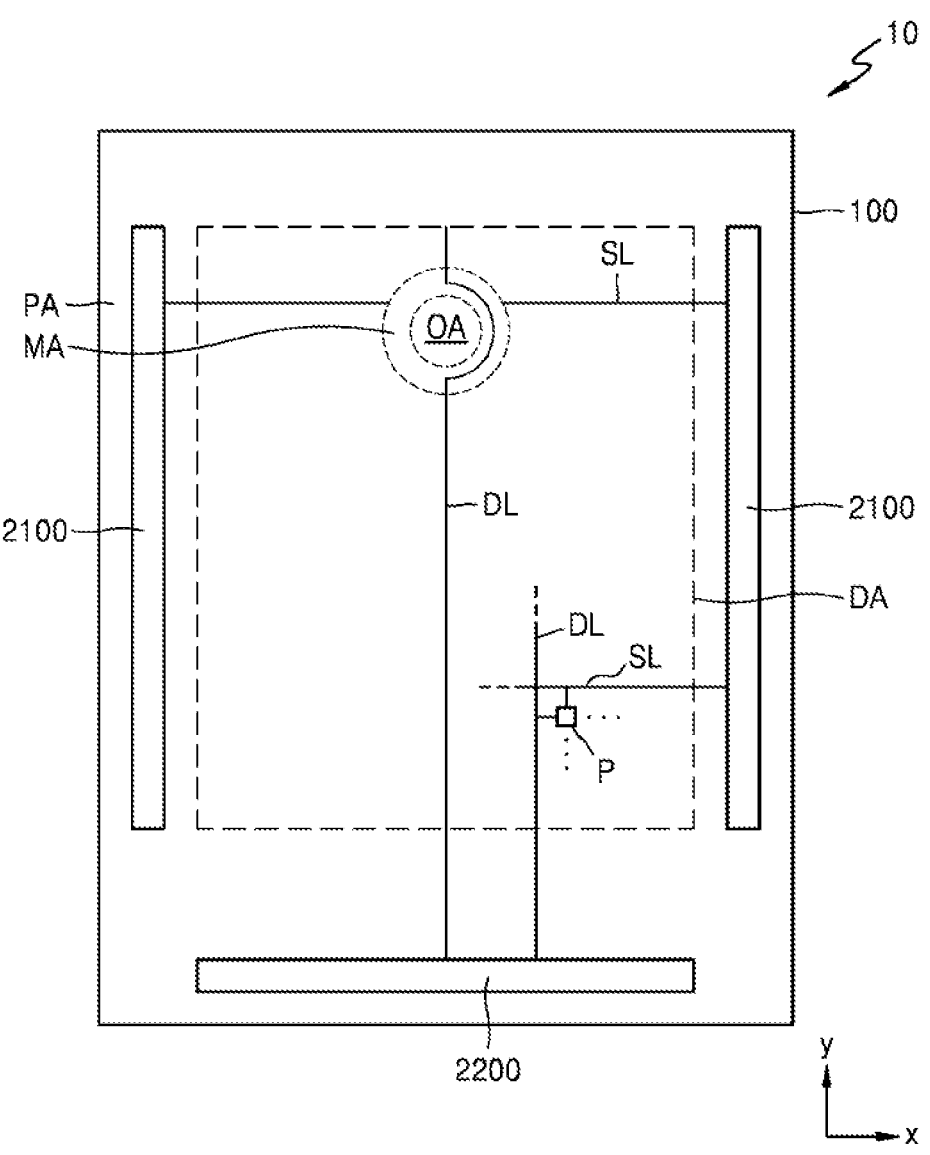
FIG. 3 is a plan view schematically illustrating a display panel according to an embodiment.

FIG. 3 is a plan view schematically illustrating the display panel 10 according to an embodiment.

Referring to FIG. 3, the display panel 10 may include the opening area OA, the display area DA, the intermediate area MA, and the peripheral area PA. For example, it may be understood that a substrate 100 included in the display panel 10 includes the opening area OA, the display area DA, the intermediate area MA, and the peripheral area PA.

The display panel 10 may include sub-pixels P arranged in the display area DA, and the display panel 10 may display an image by using light emitted from each sub-pixel P. Each sub-pixel P may emit red, green, or blue light by using the light-emitting diode. The light-emitting diode of each sub-pixel P may be electrically connected to a scan line SL and a data line DL.

A scan driver 2100 configured to provide a scan signal to each sub-pixel P, and a data driver 2200 configured to provide a data signal to each sub-pixel P may be arranged in the peripheral area PA. Also, a first main power supply wire (not shown) and a second main power supply wire (not shown) configured to respectively provide a first power voltage and a second power voltage may be arranged in the peripheral area PA. The scan driver 2100 may be arranged on each of sides (for example, the left and right sides) with the display area DA therebetween. The sub-pixel P arranged on the left based on the opening area OA may be connected to the scan driver 2100 arranged on the left, and the sub-pixel P arranged on the right based on the opening area OA may be connected to the scan driver 2100 arranged on the right.

According to an embodiment, the intermediate area MA may at least partially surround the opening area OA. The intermediate area MA is an area where the display element, such as the light-emitting diode emitting light, is not arranged, and trace lines configured to provide signals to the sub-pixels P arranged around the opening area OA may pass through the intermediate area MA. For example, the data lines DL and/or the scan lines SL cross the display area DA, while some of the data lines DL and/or the scan lines SL may bypass the intermediate area MA along an edge of the opening 10OP of the display panel 10 formed in the opening area OA. According to an embodiment, FIG. 3 illustrates that the data lines DL cross the display area DA in the y-direction while some data lines DL bypass the intermediate area MA to partially surround the opening area OA. The scan lines SL may intersect the display area DA in the x-direction and may be spaced apart from each other with the opening area OA therebetween. In other words, the scan lines SL arranged on a same row may be disconnected (or separated) from each other with the opening area OA therebetween.

FIG. 3 illustrates that the data driver 2200 is arranged adjacent to a side surface of the substrate 100, but according to an embodiment, the data driver 2200 may be disposed on a printed circuit board electrically connected to a pad arranged on a side of the display panel 10. The printed circuit board may be flexible, and a part of the printed circuit board may be bent to be located below a rear surface of the substrate 100.

Figure 4:
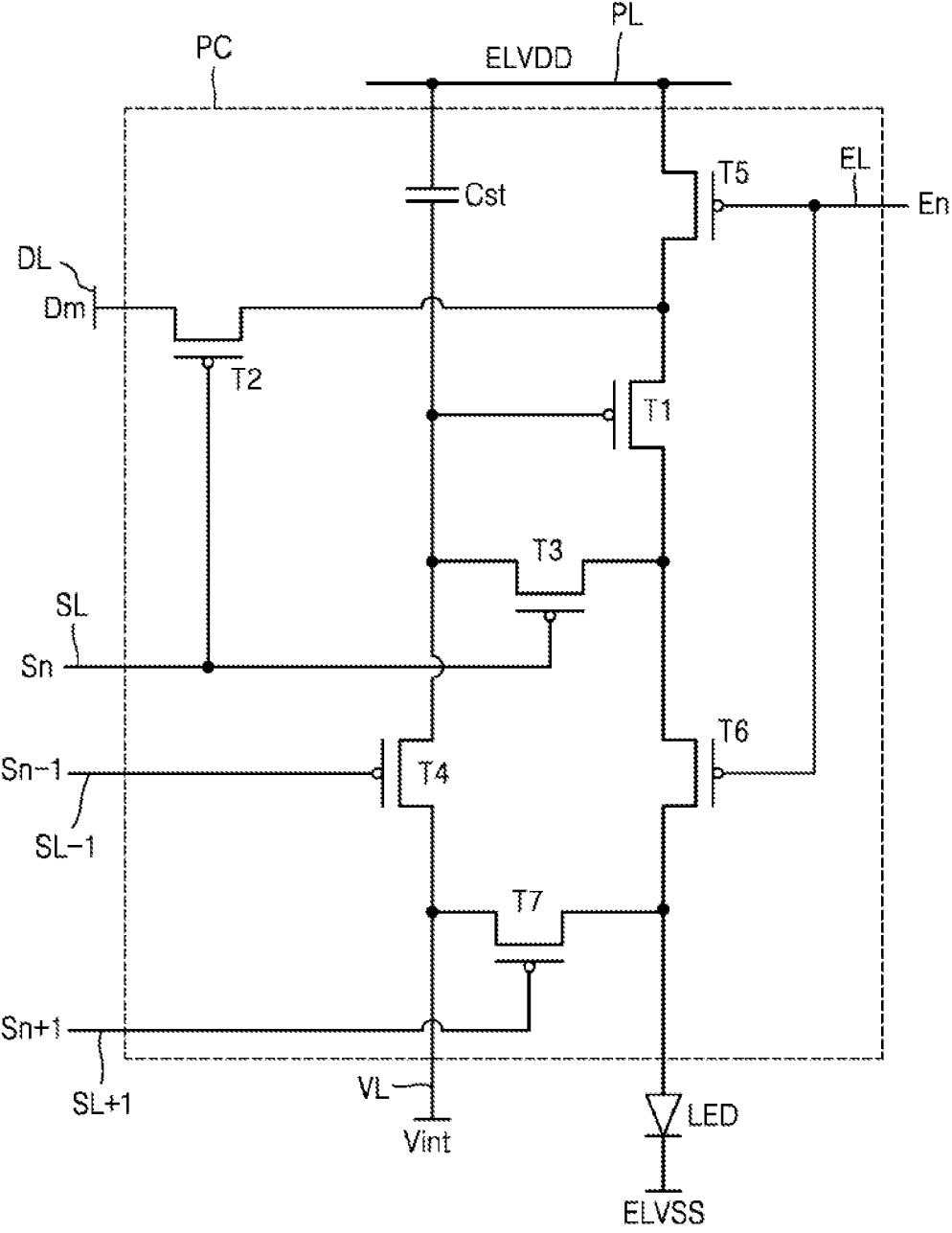
FIG. 4 is a schematic diagram of an equivalent circuit illustrating a light-emitting diode and a circuit connected to the light-emitting diode, according to an embodiment.

FIG. 4 is a schematic diagram of an equivalent circuit illustrating a light-emitting diode LED and a pixel circuit PC electrically connected to the light-emitting diode LED, according to an embodiment.

Referring to FIG. 4, the sub-pixel P described with reference to FIG. 3 may emit light through the light-emitting diode LED, and the light-emitting diode LED may be electrically connected to the pixel circuit PC.

The pixel circuit PC may include a first transistor T1, a second transistor T2, a third transistor T3, a fourth transistor T4, a fifth transistor T5, a sixth transistor T6, a seventh transistor T7, and a storage capacitor Cst.

The first transistor T1 may be a driving thin-film transistor, may be electrically connected to a driving voltage line PL and the storage capacitor Cst, and may be configured to control a driving current flowing through the light-emitting diode LED from the driving voltage line PL in response to a voltage value stored in the storage capacitor Cst. The light-emitting diode LED may emit light of a luminance (e.g., a certain or selectable luminance) according to the driving current. A second electrode (for example, a cathode) of the light-emitting diode LED may receive a second power voltage ELVSS.

The second transistor T2 may be a switching thin-film transistor, may be electrically connected to the scan line SL and the data line DL, and may be configured to transmit, to the first transistor T1, a data voltage Dm (or a data signal) input from the data line DL, based on a scan signal Sn (or a scan voltage, a switching voltage, or a switching signal) input from the scan line SL.

The storage capacitor Cst may be electrically connected to the driving voltage line PL and the first transistor T1. An electrode of the storage capacitor Cst may be electrically connected to the driving voltage line PL, and another electrode of the storage capacitor Cst may be electrically connected to a gate electrode of the first transistor T1. The storage capacitor Cst may store a difference between a first driving voltage ELVDD applied to the driving voltage line PL and a gate voltage of the first transistor T1, and may be configured to maintain the gate voltage of the first transistor T1.

The third transistor T3 may be a compensation thin-film transistor, and a gate electrode of the third transistor T3 may be electrically connected to the scan line SL. A source electrode (or a drain electrode) of the third transistor T3 may be electrically connected to a drain electrode (or a source electrode) of the first transistor T1 while being electrically connected to a first electrode (for example, an anode) of the light-emitting diode LED through the sixth transistor T6. The drain electrode (or the source electrode) of the third transistor T3 may be electrically connected to another electrode of the storage capacitor Cst, a source electrode (or a drain electrode) of the fourth transistor T4, and the gate electrode of the first transistor T1. The third transistor T3 may be turned on according to the scan signal Sn received through the scan line SL, thereby electrically connecting the gate electrode and the drain electrode of the first transistor T1 to each other for diode-connection of the first transistor T1.

The fourth transistor T4 may be an initialization thin-film transistor, and a gate electrode of the fourth transistor T4 may be electrically connected to a previous scan line SL−1. The drain electrode (or the source electrode) of the fourth transistor T4 may be electrically connected to an initialization voltage line VL. The source electrode (or the drain electrode) of the fourth transistor T4 may be electrically connected to another electrode of the storage capacitor Cst, the drain electrode (or the source electrode) of the third transistor T3, and the gate electrode of the first transistor T1. The fourth transistor T4 may be turned on according to a previous scan signal Sn−1 received through the previous scan line SL−1 to transmit an initialization voltage Vint to the gate electrode of the first transistor T1, thereby performing an initialization operation of initializing a voltage of the gate electrode of the first transistor T1.

The fifth transistor T5 is an operation control thin-film transistor, and a gate electrode of the fifth transistor T5 may be electrically connected to an emission control line EL. A source electrode (or a drain electrode) of the fifth transistor T5 may be electrically connected to the driving voltage line PL. The drain electrode (or the source electrode) of the fifth transistor T5 may be electrically connected to the source electrode (or the drain electrode) of the first transistor T1 and the drain electrode (or the source electrode) of the second transistor T2.

The sixth transistor T6 is an emission control thin-film transistor, and a gate electrode thereof may be electrically connected to the emission control line EL. A source electrode (or a drain electrode) of the sixth transistor T6 may be electrically connected to the drain electrode (or the source electrode) of the first transistor T1 and the source electrode (or the drain electrode) of the third transistor T3. The drain electrode (or the source electrode) of the sixth transistor T6 may be electrically connected to a first electrode of the light-emitting diode LED. The fifth transistor T5 and the sixth transistor T6 may be simultaneously turned on according to an emission control signal En received through the emission control line EL to transmit the first driving voltage ELVDD to the light-emitting diode LED, and thus a driving current may flow in the light-emitting diode LED.

The seventh transistor T7 may be an initialization thin-film transistor configured to initialize the first electrode of the light-emitting diode LED. A gate electrode of the seventh transistor T7 may be electrically connected to a next scan line SL+1. A source electrode (or a drain electrode) of the seventh transistor T7 may be electrically connected to the first electrode of the light-emitting diode LED. The drain electrode (or the source electrode) of the seventh transistor T7 may be electrically connected to the initialization voltage line VL. The seventh transistor T7 may be turned on according to a next scan signal Sn+1 received through the next scan line SL+1 to initialize the first electrode of the light-emitting diode LED.

FIG. 4 illustrates that the fourth transistor T4 and the seventh transistor T7 are respectively electrically connected to the previous scan line SL−1 and the next scan line SL+1, but the fourth transistor T4 and the seventh transistor T7 may both be electrically connected to the previous scan line SL−1 to be driven according to the previous scan signal Sn−1.

An electrode of the storage capacitor Cst may be electrically connected to the driving voltage line PL. Another electrode of the storage capacitor Cst may be electrically connected to all of the gate electrode of the first transistor T1, the drain electrode (or the source electrode) of the third transistor T3, and the source electrode (or the drain electrode) of the fourth transistor T4.

The second electrode of the light-emitting diode LED may receive the second power voltage ELVSS. The light-emitting diode LED may emit light by receiving the driving current from the first transistor T1.

According to an embodiment, the first to seventh transistors T1 to T7 may all include a semiconductor layer including silicon. However, the disclosure is not limited thereto.

According to an embodiment, at least one of the first to seventh transistors T1 to T7 may include a semiconductor layer including an oxide, and remaining transistors may include a semiconductor layer including silicon. In detail, the first transistor T1 that directly affects brightness of the display panel 10 may be configured to include a silicon semiconductor configured of polycrystalline silicon having high reliability, and accordingly, the display panel 10 of high resolution may be realized.

Because an oxide semiconductor has high carrier mobility and a low leakage current, a voltage drop is not large even in case that a driving time is long. In other words, a color change of an image caused by the voltage drop is not large even during low-frequency driving, and thus the low-frequency driving is possible. As such, because the oxide semiconductor has a low leakage current, at least one of the third transistor T3 and the fourth transistor T4 electrically connected to the gate electrode of the first transistor T1 may include the oxide semiconductor so as to prevent a leakage current that may flow to the gate electrode of the first transistor T1 while reducing power consumption. A trace line and/or a voltage line may be added to the pixel circuit PC of FIG. 4. Also, a transistor other than the third transistor T3 and the fourth transistor T4 may include a semiconductor layer including an oxide semiconductor. For example, the seventh transistor T7 may include a semiconductor layer including an oxide semiconductor.

Figure 5:
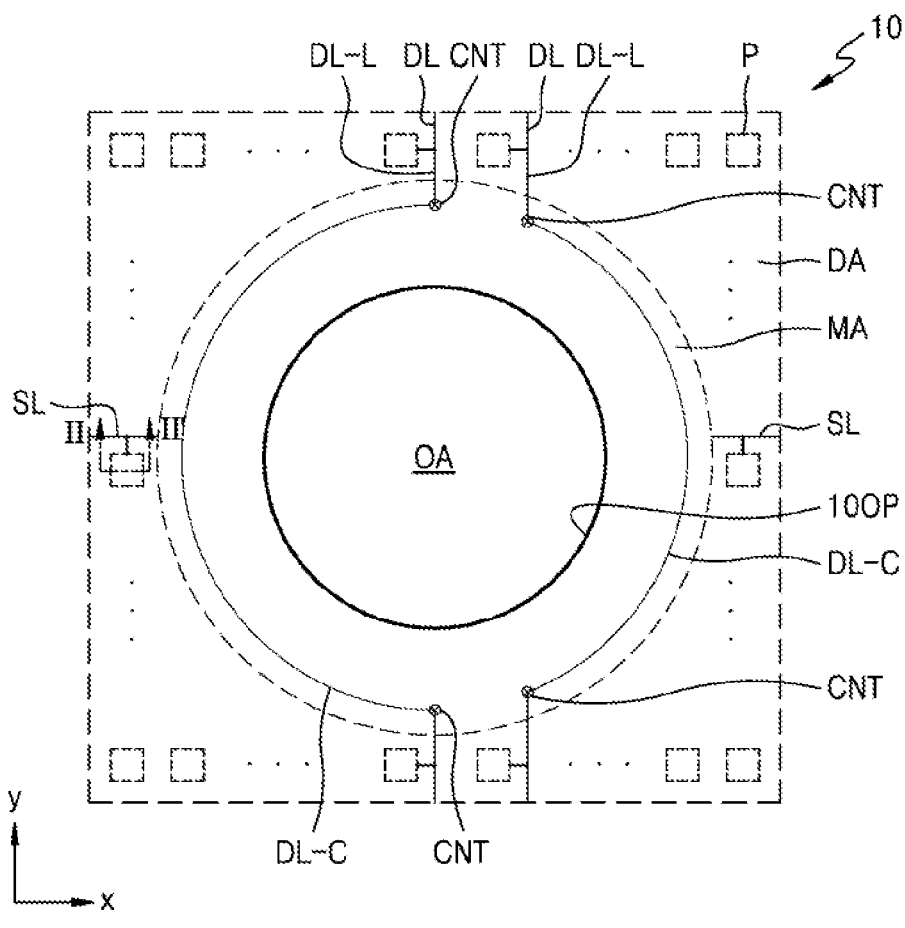
FIG. 5 is a plan view schematically illustrating a part of a display panel, according to an embodiment.

FIG. 5 is a plan view schematically illustrating a part of the display panel 10, according to an embodiment.

Referring to FIG. 5, the sub-pixels P may be arranged in the display area DA. The intermediate area MA may be located between the opening area OA and the display area DA. The sub-pixels P adjacent to the opening area OA may be spaced apart from each other based on the opening area OA in a plan view. In the plan view of FIG. 5, the sub-pixels P may be spaced apart from each other vertically based on the opening area OA or horizontally based on the opening area OA. As described above with reference to FIGS. 3 and 4, each sub-pixel P uses red, green, or blue light emitted from the light-emitting diode LED, and thus locations of the sub-pixels P of FIG. 5 may respectively correspond to locations of the light-emitting diodes LED. Accordingly, the sub-pixels P being spaced apart from each other based on the opening area OA in the plan view may indicate that the light-emitting diodes LED are spaced apart from each other based on the opening area OA in the plan view. For example, in the plan view, the light-emitting diodes LED may be spaced apart from each other vertically based on the opening area OA or horizontally based on the opening area OA.

Among trace lines supplying signals to the pixel circuit PC electrically connected to the light-emitting diode LED of each sub-pixel P, trace lines adjacent to the opening area OA may bypass the opening area OA and/or the opening 10OP. Some of the data lines DL passing the display area DA may extend in the ±y-directions to provide a data signal to the sub-pixels P arranged vertically with the opening area OA therebetween, while bypassing along edges of the opening area OA and/or the opening 10OP in the intermediate area MA.

According to an embodiment, the data line DL may include a bypassing portion DL-C and an extending portion DL-L. The bypassing portion DL-C may bypass along the edges of the opening area OA and/or the opening 10OP among the data line DL. The extending portion DL-L may be disposed on the display area DA along the ±y-direction.

The bypassing portion DL-C and the extending portion DL-L may be arranged on different layers. The bypassing portion DL-C and the extending portion DL-L may be electrically connected to each other through a contact hole CNT located in the intermediate area MA. FIG. 5 illustrates that the contact hole CNT is located in the intermediate area MA, but the disclosure is not limited thereto. For example, the contact hole CNT may be arranged in the display area DA.

As another example, the bypassing portion DL-C and the extending portion DL-L may be arranged on a same layer. For example, the bypassing portion DL-C and the extending portion DL-L may be integral with each other.

The scan lines SL may be electrically disconnected or separated from each other based on the opening area OA. The scan lines SL arranged on the left based on the opening area OA may receive a signal from the scan driver 2100 arranged on the left based on the display area DA as described above with reference to FIG. 3, and the scan lines SL arranged on the right of the opening area OA may receive a signal from the scan driver 2100 arranged on the right of the display area DA of FIG. 3. However, the disclosure is not limited thereto. Some of the scan lines SL passing the display area DA may extend in the ±x-direction to provide a scan signal to the sub-pixels P arranged horizontally with the opening area OA therebetween, while bypassing along the edges of the opening area OA and/or the opening 10OP in the intermediate area MA.

Figure 6:
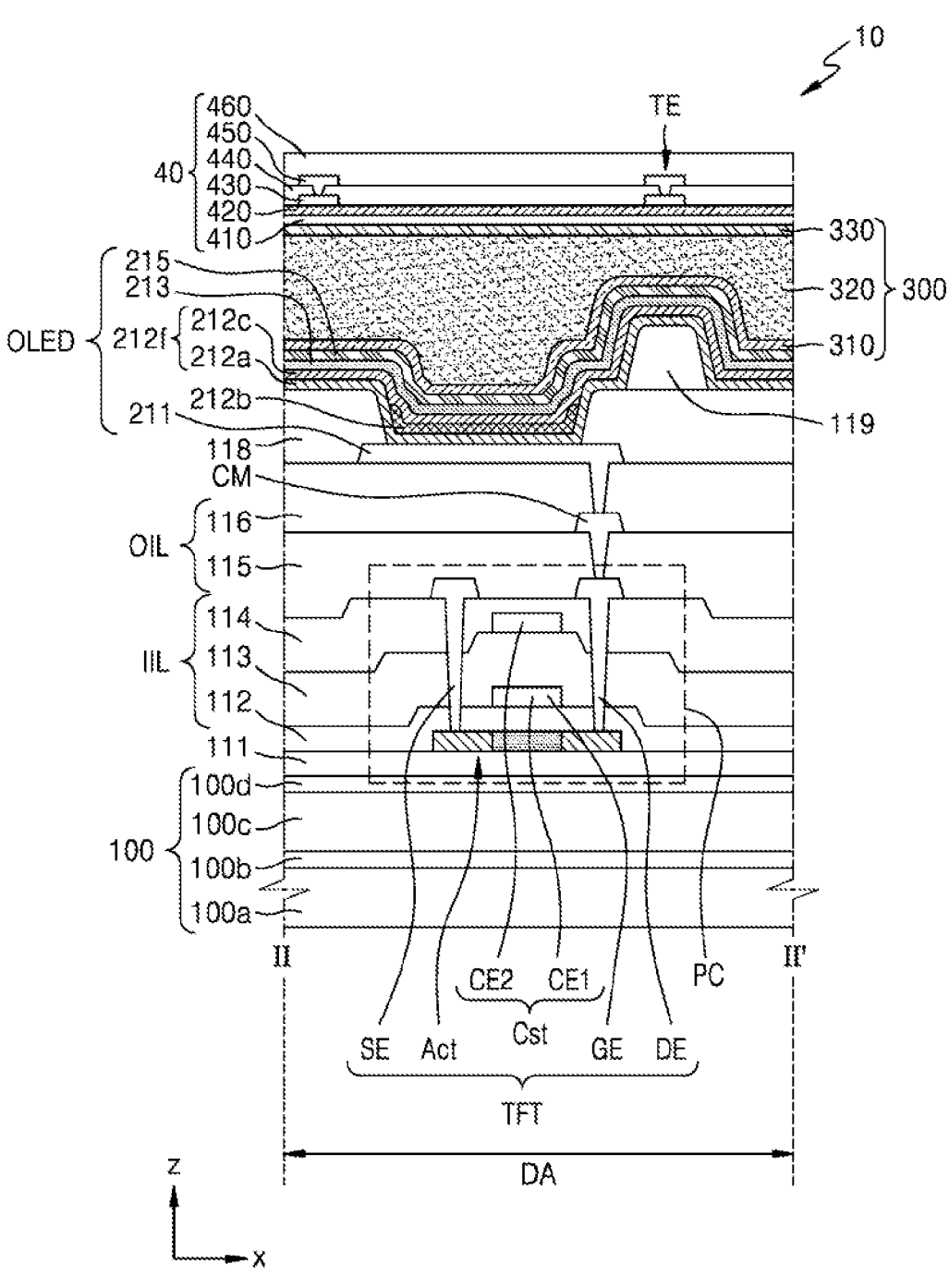
FIG. 6 is a schematic cross-sectional view of a display panel according to an embodiment.

FIG. 6 is a schematic cross-sectional view of the display panel 10 taken along line II-II' of FIG. 5, according to an embodiment.

Referring to FIG. 6, the display panel 10 may include the substrate 100, an inorganic insulating layer IIL, an organic insulating layer OIL, the pixel circuit PC, a connection electrode CM, an organic light-emitting diode OLED, a pixel-defining layer 118, a spacer 119, and an encapsulation layer 300. In other words, the substrate 100, the inorganic insulating layer IIL, the organic insulating layer OIL, the pixel circuit PC, the connection electrode CM, the organic light-emitting diode OLED, the pixel-defining layer 118, the spacer 119, and the encapsulation layer 300 may be arranged in the display area DA of the display panel 10.

The substrate 100 may include a first base layer 100*a*, a first barrier layer 100*b*, a second base layer 100*c*, and a second barrier layer 100*d*. According to an embodiment, the first base layer 100*a*, the first barrier layer 100*b*, the second base layer 100*c*, and the second barrier layer 100*d* may be sequentially stacked each other in a thickness direction of the substrate 100.

At least one of the first base layer 100*a* and the second base layer 100*c* may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100*b* and second barrier layer 100*d* may be barrier layers preventing penetration of an external foreign material, and may each be a single layer or a multi-layer including an inorganic material, such as silicon nitride $(SiN_x)$, silicon oxide $(SiO_2)$, and/or silicon oxynitride (SiON). However, the embodiments are not limited thereto.

A buffer layer 111 may be disposed on the substrate 100. The buffer layer 111 may include an inorganic insulating material, such as $SiN_x$, SiON, or $SiO_2$, and may be a single layer or multi-layer including the inorganic insulating material.

The inorganic insulating layer IIL may be disposed on the buffer layer 111. The inorganic insulating layer IIL may include a first gate insulating layer 112, a second gate insulating layer 113, and an interlayer insulating layer 114.

The pixel circuit PC may be arranged in the display area DA. The pixel circuit PC may include a thin-film transistor TFT and the storage capacitor Cst. The thin-film transistor TFT may include a semiconductor layer Act, a gate electrode GE, a source electrode SE, and a drain electrode DE.

The semiconductor layer Act may be disposed on the buffer layer 111. The semiconductor layer Act may include polysilicon. As another example, the semiconductor layer Act may include at least one of amorphous silicon, an oxide semiconductor, and an organic semiconductor. The semiconductor layer Act may include a channel region, and drain region and a source region, which are arranged on sides (or both sides) of the channel region respectively.

The gate electrode GE may be disposed on the semiconductor layer Act. The gate electrode GE may overlap the channel region. The gate electrode GE may include a low-resistance metal material. The gate electrode GE may include a conductive material such as molybdenum (Mo), aluminum (Al), copper (Cu), or titanium (Ti), and may be formed in a multi-layer or single layer including the conductive material. However, the embodiments are not limited thereto.

The first gate insulating layer 112 may be arranged between the semiconductor layer Act and the gate electrode GE. The first gate insulating layer 112 may include an inorganic insulating material, such as $SiO_2$, $SiN_x$, SiON, aluminum oxide $(Al_2O_3)$, titanium oxide $(TiO_2)$, tantalum oxide $(Ta_2O_5)$, hafnium oxide $(HfO_2)$, or zinc oxide (ZnO). However, the embodiments are not limited thereto.

The second gate insulating layer 113 may be disposed on the gate electrode GE. The second gate insulating layer 113 may be provided to cover the gate electrode GE. The second gate insulating layer 113 may include an inorganic insulating material, such as $SiO_2$, $SiN_x$, $SiON$, $Al_2O_3$, $TiO_2$, $Ta_2O_5$, $HfO_2$, or $ZnO$. However, the embodiments are not limited thereto.

An upper electrode CE2 of the storage capacitor Cst may be disposed on the second gate insulating layer 113. The upper electrode CE2 may overlap the gate electrode GE disposed therebelow. The upper electrode CE2 and the gate electrode GE, which overlap each other with the second gate insulating layer 113 therebetween, may form the storage capacitor Cst. In other words, the gate electrode GE may operate as a lower electrode CE1 of the storage capacitor Cst.

As such, the storage capacitor Cst and the thin-film transistor TFT may overlap each other (e.g., in a view or direction). However, the disclosure is not limited thereto. For example, the storage capacitor Cst may not overlap the thin-film transistor TFT. In other words, the lower electrode CE1 of the storage capacitor Cst may be spaced apart from the gate electrode GE of the thin-film transistor TFT, as a component separate from the gate electrode GE of the thin-film transistor TFT.

The upper electrode CE2 may include at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu), and may be a single layer or multi-layer including such a material. However, the embodiments are not limited thereto.

The interlayer insulating layer 114 may be disposed on the upper electrode CE2. The interlayer insulating layer 114 may cover the upper electrode CE2. The interlayer insulating layer 114 may include at least one of $SiO_2$, $SiN_x$, $SiON$, $Al_2O_3$, $TiO_2$, $Ta_2O_5$, $HfO_2$, and $ZnO$. The interlayer insulating layer 114 may be a single layer or multi-layer including the inorganic insulating material described above. However, the embodiments are not limited thereto.

The drain electrode DE and the source electrode SE may each be disposed on the interlayer insulating layer 114. The drain electrode DE and the source electrode SE may each be electrically connected to the semiconductor layer Act through a contact hole provided in the first gate insulating layer 112, the second gate insulating layer 113, and the interlayer insulating layer 114. The drain electrode DE and the source electrode SE may include a material having good conductivity. The drain electrode DE and the source electrode SE may include a conductive material including Mo, Al, Cu, and/or Ti, and may be formed in a multi-layer or single layer including the above material. For example, the drain electrode DE and the source electrode SE may have a multi-layer structure of Ti/Al/Ti. However, the embodiments are not limited thereto.

The organic insulating layer OIL may be disposed on the inorganic insulating layer IIL. The organic insulating layer OIL may include a first organic insulating layer 115 and a second organic insulating layer 116. FIG. 6 illustrates that two organic insulating layers OIL are provided, but the disclosure is not limited thereto. Three or four organic insulating layers OIL may be provided.

The first organic insulating layer 115 may cover the drain electrode DE and the source electrode SE. The first organic insulating layer 115 may include an organic insulating material, such as a general-purpose polymer, for example, polymethylmethacrylate (PMMA) or polystyrene (PS), a polymer derivate having a phenol-based group, an acrylic-based polymer, an imide-based polymer, an arylether-based polymer, an amide-based polymer, a fluorine-based polymer, a p-xylene-based polymer, a vinyl alcohol-based polymer, or a blend thereof. However, the embodiments are not limited thereto.

The connection electrode CM may be disposed on the first organic insulating layer 115. The connection electrode CM may be electrically connected to the drain electrode DE or the source electrode SE through a contact hole of the first organic insulating layer 115. The connection electrode CM may include a material having good conductivity. The connection electrode CM may include a conductive material including Mo, Al, Cu, and/or Ti, and may be formed in a multi-layer or single layer including the above material. For example, the connection electrode CM may have a multi-layer structure of Ti/Al/Ti. However, the embodiments are not limited thereto.

The second organic insulating layer 116 may be disposed on the connection electrode CM. The second organic insulating layer 116 may cover the connection electrode CM. The second organic insulating layer 116 and the first organic insulating layer 115 may include a same or different materials.

A light-emitting diode may be disposed on the second organic insulating layer 116. For example, the organic light-emitting diode OLED may be disposed on the second organic insulating layer 116. As another example, although not illustrated, an inorganic light-emitting diode may be disposed on the second organic insulating layer 116.

The organic light-emitting diode OLED may emit red, green, or blue light or may emit red, green, blue, or white light. The organic light-emitting diode OLED may include a first electrode 211, an emission layer 212b, a functional layer 212f, a second electrode 213, and a capping layer 215. The first electrode 211 may be a pixel electrode (for example, an anode) of the organic light-emitting diode OLED, and the second electrode 213 may be an opposite electrode (for example, a cathode) of the organic light-emitting diode OLED.

The first electrode 211 may be disposed on the second organic insulating layer 116. The first electrode 211 may be electrically connected to the connection electrode CM through a contact hole defined in the second organic insulating layer 116. The first electrode 211 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to an embodiment, the first electrode 211 may include a reflective layer including at least one of Ag, Mg, Al, Pt, Pd, Au, Ni, Nd, Ir, Cr, and a compound thereof. According to an embodiment, the first electrode 211 may further include a layer formed of ITO, IZO, ZnO, and/or $In_2O_3$, on or below the reflective layer. For example, the first electrode 211 may have a multi-layer structure of ITO/Ag/ITO. However, the embodiments are not limited thereto.

The pixel-defining layer 118 that defines an opening exposing at least a part of the first electrode 211 may be disposed on the first electrode 211. An emission region of light emitted from the organic light-emitting diode OLED may be defined by the opening defined in the pixel-defining layer 118. For example, a width of the opening may correspond to a width of the emission region.

The pixel-defining layer 118 may include an organic insulating material. As another example, the pixel-defining layer 118 may include an inorganic insulating material, such as silicon nitride, silicon oxynitride, or silicon oxide. As another example, the pixel-defining layer 118 may include an organic insulating material and/or an inorganic insulating material. According to an embodiment, the pixel-defining layer 118 may include a light-blocking material. The light-blocking material may include at least one of a resin or paste including carbon black, carbon nanotubes, black dyes, metal particles such as nickel, aluminum, molybdenum, and an alloy thereof, metal oxide particles (for example, chromium oxide), and metal nitride particles (for example, chromium nitride). In case that the pixel-defining layer 118 includes the light-blocking material, reflection of external light caused by metal structures arranged at a lower portion of the pixel-defining layer 118 may be reduced.

The spacer 119 may be disposed on the pixel-defining layer 118. The spacer 119 may include an organic insulating material, such as polyimide. As another example, the spacer 119 may include an inorganic insulating material, such as $SiN_X$ or $SiO_2$, or may include an organic insulating material and an inorganic insulating material.

According to an embodiment, the spacer 119 and the pixel-defining layer 118 may include a same material. The pixel-defining layer 118 and the spacer 119 may be formed together during a mask process using a half-tone mask. As another example, the spacer 119 and the pixel-defining layer 118 may include different materials.

The emission layer 212b may be arranged at the opening of the pixel-defining layer 118. The emission layer 212b may include a high-molecular weight organic material or low-molecular weight organic material, which emit light of a color.

The functional layer 212f may include a first functional layer 212a and a second functional layer 212c. The first functional layer 212a may be disposed between the first electrode 211 and the emission layer 212b, and the second functional layer 212c may be disposed between the emission layer 212b and the second electrode 213. However, at least one of the first functional layer 212a and the second functional layer 212c may be omitted. Hereinafter, a case where the first functional layer 212a and the second functional layer 212c are each arranged will be described in detail.

The first functional layer 212a may include a hole transport layer (HTL) and/or a hole injection layer (HIL). The second functional layer 212c may include an electron transport layer (ETL) and/or an electron injection layer (EIL). Similar to the second electrode 213 described below, the first functional layer 212a and/or the second functional layer 212c may be a common layer formed to entirely cover the substrate 100.

The second electrode 213 may be disposed on the functional layer 212f. The second electrode 213 may include a conductive material with a low work function. For example, the second electrode 213 may include a (semi-)transparent layer including Ag, Mg, Al, Pt, Pd, Au, Ni, Nd, Ir, Cr, lithium (Li), calcium (Ca), or an alloy thereof. As another example, the second electrode 213 may further include a layer including ITO, IZO, ZnO, or $In_2O_3$, on the (semi-)transparent layer including the above material.

According to an embodiment, the capping layer 215 may be disposed on the second electrode 213. The capping layer 215 may include lithium fluoride (LiF), an inorganic material, and/or an organic material.

The encapsulation layer 300 may be disposed on the organic light-emitting diode OLED. The encapsulation layer 300 may cover the organic light-emitting diode OLED. The encapsulation layer 300 may be disposed on the second electrode 213 and/or the capping layer 215. According to an embodiment, the encapsulation layer 300 may include at least one inorganic layer and at least one organic layer. FIG. 6 illustrates that the encapsulation layer 300 includes a first inorganic layer 310, an organic layer 320, and a second inorganic layer 330, which are sequentially stacked each other.

The first inorganic layer 310 and the second inorganic layer 330 may include at least one inorganic materials from among $Al_2O_3$, $TiO_2$, $Ta_2O_5$, $HfO_2$, zinc oxide, $SiO_2$, $SiN_X$, and SiON. The first inorganic layer 310 and the second inorganic layer 330 may be a single layer or multi-layer including the above material. The organic layer 320 may include a polymer-based material. Examples of the polymer-based material may include an acrylic resin, an epoxy resin, polyimide, and polyethylene. According to an embodiment, the organic layer 320 may include acrylate.

The input detection layer 40 may be disposed on the encapsulation layer 300. The input detection layer 40 may include a first touch insulating layer 410, a second touch insulating layer 420, a first conductive layer 430, a third touch insulating layer 440, a second conductive layer 450, and a planarization layer 460.

According to an embodiment, the first touch insulating layer 410 may be disposed on the second inorganic layer 330, and the second touch insulating layer 420 may be disposed on the first touch insulating layer 410. According to an embodiment, the first touch insulating layer 410 and the second touch insulating layer 420 may include an inorganic insulating material and/or an organic insulating material. For example, the first touch insulating layer 410 and the second touch insulating layer 420 may include an inorganic insulating material, such as $SiO_2$, $SiN_X$, and/or SiON.

According to an embodiment, at least one of the first touch insulating layer 410 and the second touch insulating layer 420 may be omitted. For example, the first touch insulating layer 410 may be omitted. The second touch insulating layer 420 may be disposed on the second inorganic layer 330, and the first conductive layer 430 may be disposed on the second touch insulating layer 420.

The first conductive layer 430 may be disposed on the second touch insulating layer 420, and the third touch insulating layer 440 may be disposed on the first conductive layer 430. According to an embodiment, the third touch insulating layer 440 may include an inorganic insulating material and/or an organic insulating material. For example, the third touch insulating layer 440 may include an inorganic insulating material, such as $SiO_2$, $SiN_X$, and/or SiON.

The second conductive layer 450 may be disposed on the third touch insulating layer 440. A touch electrode TE of the input detection layer 40 may have a structure to which the first conductive layer 430 and the second conductive layer 450 are electrically connected to each other. As another example, the touch electrode TE may be formed on at least one of the first conductive layer 430 and the second conductive layer 450, and include a metal line provided in the corresponding conductive layer. The first conductive layer 430 and the second conductive layer 450 may each include at least one of Al, Cu, Ti, Mo, and ITO, and have a single layer or multi-layer including the above material. For example, the first conductive layer 430 and the second conductive layer 450 may each have a three-layer structure of Ti/Al/Ti. However, the embodiments are not limited thereto.

According to an embodiment, the planarization layer 460 may cover the second conductive layer 450. The planarization layer 460 may include an organic insulating material.

Figure 7:
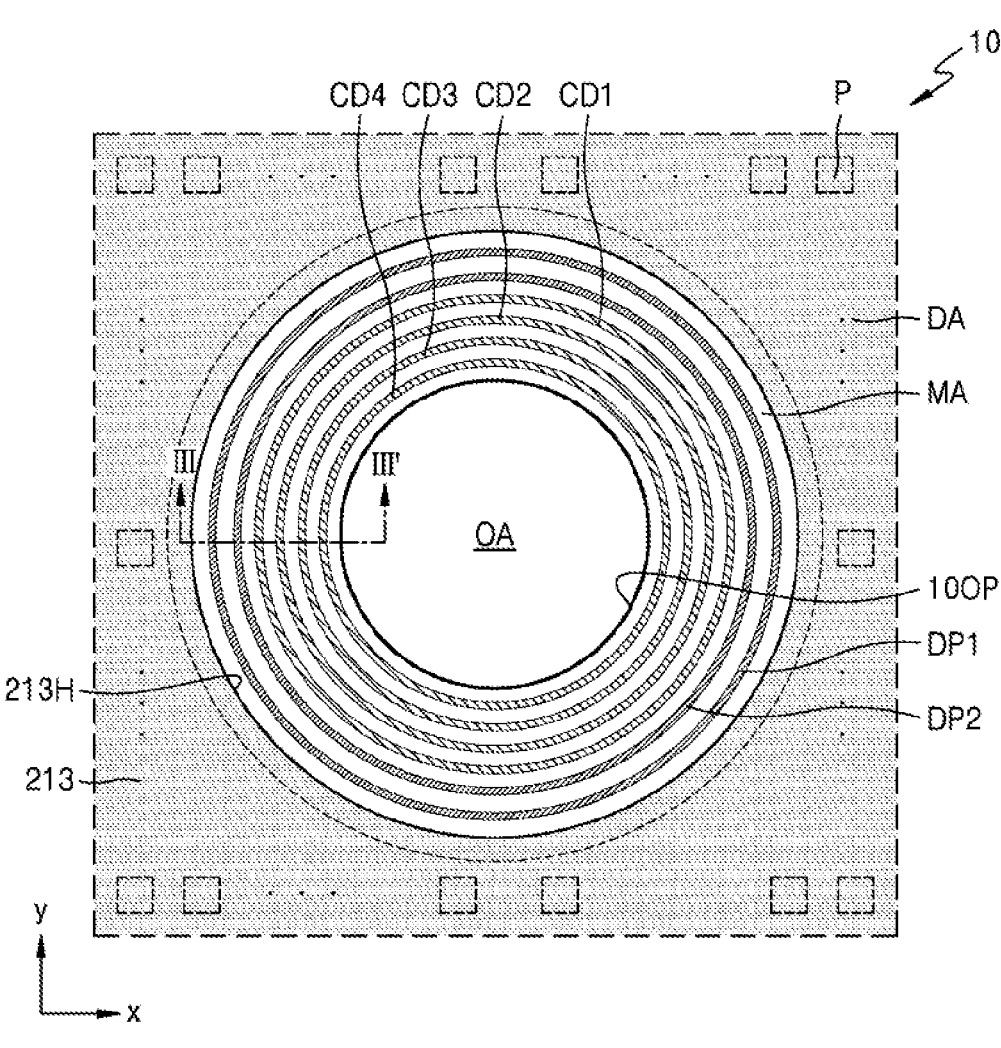
FIG. 7 is a plan view schematically illustrating a part of a display panel, according to an embodiment.

FIG. 7 is a plan view schematically illustrating a part of the display panel 10, according to an embodiment. The data line DL, the scan line SL, and the like shown in FIG. 5 may also be arranged in the display panel 10 of FIG. 7, but are omitted for convenience of descriptions.

Referring to FIG. 7, a first dam DP1 and a second dam DP2 may be arranged in the intermediate area MA. In a plan view, the first dam DP1 and the second dam DP2 may surround the opening area OA. For example, each of the first dam DP1 and the second dam DP2 may extend along an edge of the opening area OA, and may be provided in a closed-loop shape completely surrounding the opening area OA in the plan view. Also, in the plan view, the first dam DP1 and the second dam DP2 may be spaced apart from each other.

According to an embodiment, the first dam DP1 may be located between the display area DA and the opening area OA, and the second dam DP2 may be located between the first dam DP1 and the opening area OA. In other words, the second dam DP2 may be arranged (or located) closer to the opening area OA than the first dam DP1.

FIG. 7 illustrates that two dams, e.g., the first and second dams DP1 and DP2, are arranged in the intermediate area MA, but the disclosure is not limited thereto. Various modifications are possible, for example, a dam may be arranged in the intermediate area MA or three or more dams may be arranged in the intermediate area MA.

According to an embodiment, a first crack dam CD1, a second crack dam CD2, a third crack dam CD3, and a fourth crack dam CD4 may be arranged between the second dam DP2 and the opening area OA. In the plan view, the first crack dam CD1, the second crack dam CD2, the third crack dam CD3, and the fourth crack dam CD4 may surround the opening area OA. For example, each of the first crack dam CD1, the second crack dam CD2, the third crack dam CD3, and the fourth crack dam CD4 may extend along the edge of the opening area OA, and may be provided in a closed-loop shape completely surrounding the opening area OA in the plan view. Also, in the plan view, the first crack dam CD1, the second crack dam CD2, the third crack dam CD3, and the fourth crack dam CD4 may be spaced apart from each other.

FIG. 7 illustrates that four crack dams, e.g., the first crack dam CD1, the second crack dam CD2, the third crack dam CD3, and the fourth crack dam CD4, are arranged in the intermediate area MA, but the disclosure is not limited thereto. Various modifications are possible, for example, one, two, or three crack dams may be arranged in the intermediate area MA, or five or more crack dams may be arranged in the intermediate area MA.

Figure 8:
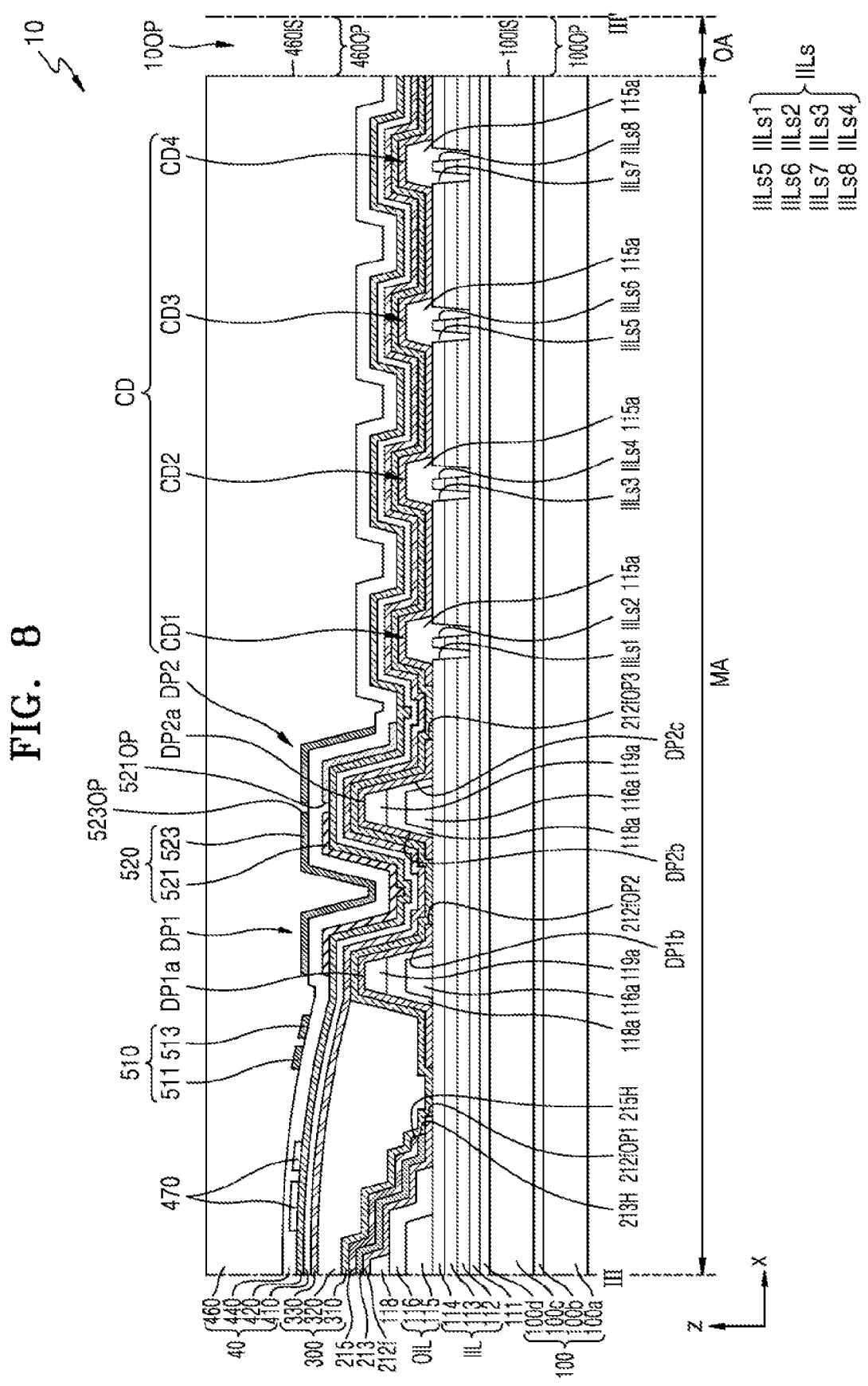
FIG. 8 is a schematic cross-sectional view of a display panel according to an embodiment.

FIG. 8 is a schematic cross-sectional view of the display panel 10 taken along line III-Ill' of FIG. 7, according to an embodiment. In detail, FIG. 8 is a schematic view for describing components arranged in the intermediate area MA, and reference numerals in FIG. 8 the same as those of FIG. 6 denote like elements, and thus repetitive descriptions will be omitted.

Referring to FIG. 8, according to an embodiment, the first base layer 100a, the first barrier layer 100b, the second base layer 100c, and the second barrier layer 100d may be consecutively arranged. For example, the first base layer 100a, the first barrier layer 100b, the second base layer 100c, and the second barrier layer 100d may be consecutively arranged in a direction from the display area DA of FIG. 6 to the opening area OA. In other words, the first base layer 100a, the first barrier layer 100b, the second base layer 100c, and the second barrier layer 100d may be arranged in the display area DA and the intermediate area MA.

According to an embodiment, the buffer layer 111 may be disposed on the substrate 100, and the inorganic insulating layer IIL may be disposed on the buffer layer 111. The inorganic insulating layer IIL may be arranged in the display area DA of FIG. 6, while extending from the display area DA to the intermediate area MA. In other words, the buffer layer 111 may be arranged in the display area DA and the intermediate area MA, and the inorganic insulating layer IIL may also be arranged in the display area DA and the intermediate area MA. As described in FIG. 6, the inorganic insulating layer IIL may include the first gate insulating layer 112, the second gate insulating layer 113, and the interlayer insulating layer 114. However, at least one of the buffer layer 111, the first gate insulating layer 112, the second gate insulating layer 113, and the interlayer insulating layer 114 may be omitted in the intermediate area MA.

The organic insulating layer OIL may be disposed on the inorganic insulating layer IIL. The organic insulating layer OIL may be arranged in the display area DA of FIG. 6, while extending from the display area DA to the intermediate area MA. In other words, the organic insulating layer OIL may be arranged in the display area DA and the intermediate area MA. As described above in FIG. 6, the organic insulating layer OIL may include the first organic insulating layer 115 and the second organic insulating layer 116. According to an embodiment, the second organic insulating layer 116 may cover a side surface of the first organic insulating layer 115. However, the disclosure is not limited thereto. For example, the second organic insulating layer 116 may expose the side surface of the first organic insulating layer 115.

Also, the pixel-defining layer 118 may be disposed on the second organic insulating layer 116. The pixel-defining layer 118 may be arranged in the display area DA of FIG. 6, while extending from the display area DA to the intermediate area MA. In other words, the pixel-defining layer 118 may be arranged in the display area DA and the intermediate area MA.

As described above in FIG. 7, the first dam DP1 and the second dam DP2 may be arranged (or located) in the intermediate area MA. The first dam DP1 and the second dam DP2 may be disposed on a top surface of the inorganic insulating layer IIL. For example, the first dam DP1 and the second dam DP2 may be disposed on a top surface of the interlayer insulating layer 114 of FIG. 6. However, the disclosure is not limited thereto. According to an embodiment, the first dam DP1 and the second dam DP2 may be disposed on a top surface of the buffer layer 111 of FIG. 6, a top surface of the first gate insulating layer 112 of FIG. 6, or a top surface of the second gate insulating layer 113 of FIG. 6.

According to an embodiment, the first dam DP1 and the second dam DP2 may be provided as layers stacked each other. Each of the first dam DP1 and the second dam DP2 may have a structure in which at least one of a first organic pattern layer 115a, a second organic pattern layer 116a, a third organic pattern layer 118a, and a fourth organic pattern layer 119a are stacked.

FIG. 8 illustrates that each of the first dam DP1 and the second dam DP2 has a structure in which the second organic pattern layer 116a, the third organic pattern layer 118a, and the fourth organic pattern layer 119a are stacked each other, but the disclosure is not limited thereto. For example, each of the first dam DP1 and the second dam DP2 may further include the first organic pattern layer 115a, or at least one of the second organic pattern layer 116a, the third organic pattern layer 118a, and the fourth organic pattern layer 119a may be replaced by the first organic pattern layer 115a. The first organic pattern layer 115a and the first organic insulating layer 115 may have a same material and may be provided in a same layer.

The functional layer 212f may be arranged in the intermediate area MA. The functional layer 212f may be arranged in the display area DA of FIG. 6, while at least a part of the functional layer 212f extends from the display area DA to the intermediate area MA. In other words, the functional layer 212f may be arranged in the display area DA and the intermediate area MA. The functional layer 212f may include at least one of the first functional layer 212a and the second functional layer 212c described in FIG. 6.

According to an embodiment, the functional layer 212f may be disconnected in the intermediate area MA. In other words, the functional layer 212f may include at least one of a first opening 212fOP1, a second opening 212fOP2, and a third opening 212fOP3 located in the intermediate area MA.

Although not illustrated, a sacrificial layer may be formed on the inorganic insulating layer IIL, the functional layer 212f may be formed on the sacrificial layer, and while the sacrificial layer is removed by irradiating or emitting a laser beam from a rear surface of the substrate 100, the functional layer 212f formed on the sacrificial layer may also be removed, and thus the first opening 212fOP1, the second opening 212fOP2, and the third opening 212fOP3 may be formed (or defined) in the functional layer 212f.

At least one of the first opening 212fOP1, the second opening 212fOP2, and the third opening 212fOP3 defined in the functional layer 212f may be disposed on the inorganic insulating layer IIL. For example, the functional layer 212f may be disposed on a top surface of the inorganic insulating layer IIL while the top surface of the inorganic insulating layer IIL may be exposed through at least one of the first opening 212fOP1, the second opening 212fOP2, and the third opening 212fOP3 defined in the functional layer 212f.

According to an embodiment, the functional layer 212f may include the first opening 212fOP1, the second opening 212fOP2, and the third opening 212fOP3. According to an embodiment, the first opening 212fOP1 may be located between the display area DA of FIG. 7 and the first dam DP1, the second opening 212fOP2 may be located between the first dam DP1 and the second dam DP2, and the third opening 212fOP3 may be located between the second dam DP2 and the opening area OA. However, the disclosure is not limited thereto. The first opening 212fOP1 and the second opening 212fOP2 may be located between the display area DA and the first dam DP1, and the third opening 212fOP3 may be located between the second dam DP2 and the opening area OA. Various modifications are possible, for example, the first opening 212fOP1 may be located between the display area DA and the first dam DP1, and the second opening 212fOP2 and the third opening 212fOP3 may be located between the second dam DP2 and the opening area OA.

Also, FIG. 8 illustrates that three openings are defined in the functional layer 212f, but various modifications are possible, for example, one, two, or four or more openings may be defined in the functional layer 212f.

According to an embodiment, at least one of the first opening 212fOP1, the second opening 212fOP2, and the third opening 212fOP3 is defined in the functional layer 212f, and thus penetration (or diffusion) of oxygen or moisture near the opening area OA to the organic light-emitting diode OLED (see FIG. 6) in the display area DA may be prevented or reduced.

The second electrode 213 and the capping layer 215 may be arranged in the intermediate area MA. The second electrode 213 and the capping layer 215 may be arranged in the display area DA of FIG. 6, while at least parts of the second electrode 213 and capping layer 215 may extend from the display area DA to the intermediate area MA. In other words, the second electrode 213 may be arranged in the display area DA and the intermediate area MA, and the capping layer 215 may also be arranged in the display area DA and the intermediate area MA.

According to an embodiment, the second electrode 213 and the capping layer 215 may be disconnected in the intermediate area MA. Holes 213H and 215H corresponding to the opening area OA may be respectively defined in the second electrode 213 and the capping layer 215 arranged in the intermediate area MA. The holes 213H and 215H defined in the second electrode 213 and capping layer 215 may overlap the opening area OA and at least a part of the intermediate area MA. At least parts of the functional layer 212f and/or the inorganic insulating layer IIL may be exposed through the holes 213H and 215H defined in the second electrode 213 and capping layer 215.

As shown in FIGS. 7 and 8, in a plan view, the area of the hole 213H defined in the second electrode 213 may be greater than the area of the opening area OA. In a plan view, the area of the hole 213H defined in the second electrode 213 may be greater than the area of the opening area OA, and thus penetration (or diffusion) of oxygen or moisture near the opening area OA to the organic light-emitting diode OLED in the display area DA may be prevented or reduced.

Also, in a plan view, the area of the hole 215H defined in the capping layer 215 may be greater than the area of the opening area OA. In a plan view, the area of the hole 215H defined in the capping layer 215 may be greater than the area of the opening area OA, and thus penetration (or diffusion) of oxygen or moisture near the opening area OA to the organic light-emitting diode OLED in the display area DA may be prevented or reduced.

The encapsulation layer 300 may be arranged in the intermediate area MA. The encapsulation layer 300 may be arranged in the display area DA of FIG. 6, while at least a part of the encapsulation layer 300 may extend from the display area DA to the intermediate area MA. According to an embodiment, the encapsulation layer 300 may include the first inorganic layer 310, the organic layer 320, and the second inorganic layer 330, which are sequentially stacked each other. Each of the first inorganic layer 310, the organic layer 320, and the second inorganic layer 330 may extend from the display area DA to the intermediate area MA. In other words, each of the first inorganic layer 310, the organic layer 320, and the second inorganic layer 330 may be arranged in the display area DA and the intermediate area MA.

The organic layer 320 is formed by coating monomers and hardening the same, and a flow of the monomers forming the organic layer 320 may be controlled by the first and second dams DP1 and DP2. In other words, by arranging the first dam DP1 and/or the second dam DP2 in the intermediate area MA, flowing of the monomers forming the organic layer 320 towards the opening area OA may be prevented or reduced. For example, an end portion of the organic layer 320 may be located at a side of the first dam DP1 and/or the second dam DP2.

The end portion of the organic layer 320 is located at a side of the first dam DP1 and/or the second dam DP2, and the first inorganic layer 310 and the second inorganic layer 330 may directly contact each other at a top surface (or upper surface) of the first dam DP1 and/or the second dam DP2.

The encapsulation layer 300 may overlap at least one of the first opening 212fOP1, the second opening 212fOP2, and the third opening 212fOP3 defined in the functional layer 212f. The first inorganic layer 310, the organic layer 320, and the second inorganic layer 330 of the encapsulation layer 300 may overlap the first opening 212fOP1 defined in the functional layer 212f.

According to an embodiment, the first inorganic layer 310 may be disposed directly on (or contact) the top surface of the inorganic insulating layer IIL having at least a part exposed by the first opening 212fOP1 defined in the functional layer 212f. Also, the first inorganic layer 310 may be disposed directly on (or contact) the top surface of the inorganic insulating layer IIL having at least a part exposed by the second opening 212fOP2 and the third opening 212fOP3 defined in the functional layer 212f.

The input detection layer 40 may be arranged in the intermediate area MA. The input detection layer 40 may be arranged in the display area DA of FIG. 6, while at least a part of the input detection layer 40 may extend from the display area DA to the intermediate area MA. According to an embodiment, the input detection layer 40 may include the first touch insulating layer 410, the second touch insulating layer 420, the third touch insulating layer 440, and the planarization layer 460, which are sequentially stacked each other, and each of the first touch insulating layer 410, the second touch insulating layer 420, the third touch insulating layer 440, and the planarization layer 460 may extend from the display area DA to the intermediate area MA. In other words, each of the first touch insulating layer 410, the second touch insulating layer 420, the third touch insulating layer 440, and the planarization layer 460 may be arranged in the display area DA and the intermediate area MA. However, the first touch insulating layer 410 and/or the second touch insulating layer 420 may be omitted.

An align mark 470 may be disposed on the second touch insulating layer 420 in the intermediate area MA. According to an embodiment, the align mark 470 and the first conductive layer 430 of FIG. 6 may be provided on a same layer and include a same material. However, the disclosure is not limited thereto. For example, the align mark 470 and the second conductive layer 450 of FIG. 6 may be provided on a same layer and include a same material.

According to an embodiment, the align mark 470 may be located between the display area DA and the first dam DP1. By performing a laser process using the align mark 470 located between the display area DA and the first dam DP1, accuracy of the laser process may be increased and occurrence of a cutting fault may be prevented or reduced.

According to an embodiment, a crack detection layer 510 may be disposed on the third touch insulating layer 440. The crack detection layer 510 may include a first crack detection layer 511 and a second crack detection layer 513. According to an embodiment, the crack detection layer 510 may be located between the display area DA and the first dam DP1. Also, the crack detection layer 510 may be located between the first dam DP1 and the first opening 212fOP1 defined in the functional layer 212f.

According to an embodiment, a metal layer 520 may be arranged in the intermediate area MA. According to an embodiment, the metal layer 520 may be disposed on the first dam DP1 and the second dam DP2. As another example, the metal layer 520 may overlap at least one of the first dam DP1 and the second dam DP2. As another example, the metal layer 520 may cover at least one of the first dam DP1 and the second dam DP2.

According to an embodiment, the metal layer 520 may at least partially overlap a top surface DP1a of the first dam DP1 and at least partially overlap a first side surface DP1b of the first dam DP1. The first side surface DP1b of the first dam DP1 may denote a side surface adjacent to the second dam DP2 from among side surfaces of the first dam DP1. Also, the metal layer 520 may at least partially overlap a top surface DP2a of the second dam DP2, a first side surface DP2b of the second dam DP2, and a second side surface DP2c of the second dam DP2. The first side surface DP2b of the second dam DP2 may denote a side surface adjacent to the first dam DP1 from among side surfaces of the second dam DP2, and the second side surface DP2c of the second dam DP2 may denote a side surface adjacent to the opening area OA from among the side surfaces of the second dam DP2.

According to an embodiment, the metal layer 520 may include a first metal layer 521 and a second metal layer 523. The first metal layer 521 may be disposed on the second touch insulating layer 420, and the second metal layer 523 may be disposed on the third touch insulating layer 440. For example, the first metal layer 521 and the first conductive layer 430 of FIG. 6 may be provided in a same layer and include a same material, and the second metal layer 523 and the second conductive layer 450 of FIG. 6 may be provided in a same layer and include a same material. However, the disclosure is not limited thereto.

According to an embodiment, the first metal layer 521 and/or the second metal layer 523 may at least partially overlap the top surface DP1a of the first dam DP1, and at least partially overlap the first side surface DP1b of the first dam DP1. Also, the first metal layer 521 and/or the second metal layer 523 may at least partially overlap the top surface DP2a of the second dam DP2, the first side surface DP2b of the second dam DP2, and the second side surface DP2c of the second dam DP2.

According to an embodiment, openings 521OP and 523OP overlapping the top surface DP2a of the second dam DP2 may be defined in the first metal layer 521 and the second metal layer 523, respectively.

The openings 521OP and 523OP overlapping the second dam DP2 are respectively defined in the first metal layer 521 and the second metal layer 523, and thus transmission (or propagation) of a crack generated in the opening area OA and/or the intermediate area MA around the opening area OA to the display area DA may be prevented or reduced.

According to an embodiment, at least one groove IILs may be formed (or defined) in the inorganic insulating layer IIL. The grooves IILs may be formed (or defined) as at least a part of the inorganic insulating layer IIL is removed. In detail, the grooves IILs may be formed (or defined) as at least parts of the first gate insulating layer 112, second gate insulating layer 113, and interlayer insulating layer 114 are removed. At least a part of a top surface of the buffer layer 111 may be exposed by the grooves IILs formed (or defined) in the inorganic insulating layer IIL. As another example, although not illustrated, the grooves IILs may be formed (or defined) in the buffer layer 111 as at least a part of the buffer layer 111 is removed.

According to an embodiment, the grooves IILs defined in the inorganic insulating layer IIL may be arranged along a circumference of the opening area OA. For example, each of the grooves IILs defined in the inorganic insulating layer IIL may extend along the edge of the opening area OA, and may be provided in a closed-loop shape completely surrounding the opening area OA in a plan view.

|

By providing at least one groove IILs in the inorganic insulating layer IIL in the intermediate area MA, transmission of the crack generated in the opening area OA and/or the intermediate area MA around the opening area OA to the display area DA may be prevented or reduced.

Also, FIG. 8 illustrates that eight grooves, e.g., first to eighth grooves IILs1 to IILs8, are provided in the inorganic insulating layer IIL, but the disclosure is not limited thereto. Any number of grooves IILs may be formed (or defined) in the inorganic insulating layer IIL, for example, four grooves IILs may be provided in the inorganic insulating layer IIL or ten grooves IILs may be provided in the inorganic insulating layer IIL.

According to an embodiment, crack dams CD may be arranged in the intermediate area MA. The crack dams CD may be arranged along the circumference of the opening area OA. For example, each of the crack dams CD may extend along the edge of the opening area OA, and may be provided in a closed-loop shape completely surrounding the opening area OA in a plan view.

According to an embodiment, the crack dams CD may include the first crack dam CD1, the second crack dam CD2, the third crack dam CD3, and the fourth crack dam CD4. FIG. 8 illustrates that four crack dams, i.e., the first crack dam CD1, the second crack dam CD2, the third crack dam CD3, and the fourth crack dam CD4, are arranged in the intermediate area MA, but the disclosure is not limited thereto. For example, two, three, or five crack dams CD may be arranged in the intermediate area MA.

According to an embodiment, the first crack dam CD1 may be located between the second dam DP2 and the opening area OA, the second crack dam CD2 may be located between the first crack dam CD1 and the opening area OA, the third crack dam CD3 may be located between the second crack dam CD2 and the opening area OA, and the fourth crack dam CD4 may be located between the third crack dam CD3 and the opening area OA.

According to an embodiment, the third opening 212/OP3 defined in the functional layer 212/ may be located between the second dam DP2 and the first crack dam CD1. However, the disclosure is not limited thereto. Various modifications are possible, for example, the third opening 212/OP3 defined in the functional layer 212/ may be located between the first crack dam CD1 and the second crack dam CD2 or between the second crack dam CD2 and the third crack dam CD3.

According to an embodiment, each of the crack dams CD may be disposed on the inorganic insulating layer IIL. The crack dam CD may include the first organic pattern layer 115*a*. In other words, each crack dam CD may be provided as the first organic pattern layer 115*a*. However, the disclosure is not limited thereto. For example, each crack dam CD may be provided as the second organic pattern layer 116*a*, the third organic pattern layer 118*a*, or the fourth organic pattern layer 119*a*.

According to an embodiment, each crack dam CD may fill the groove IILs formed (or defined) in the inorganic insulating layer IIL. The first crack dam CD1 may fill at least one groove IILs formed (or defined) in the inorganic insulating layer IIL. For example, the first crack dam CD1 may fill the first groove IILs1 and the second groove IILs2 formed (or defined) in the inorganic insulating layer IIL.

Also, the second crack dam CD2 may fill at least one groove IILs formed (or defined) in the inorganic insulating layer IIL. For example, the second crack dam CD2 may fill the third groove IILs3 and the fourth groove IILs4 formed (or defined) in the inorganic insulating layer IIL.

The third crack dam CD3 may fill at least one groove IILs formed (or defined) in the inorganic insulating layer IIL. For example, the third crack dam CD3 may fill the fifth groove IILs5 and the sixth groove IILs6 formed (or defined) in the inorganic insulating layer IIL.

The fourth crack dam CD4 may fill at least one groove IILs formed (or defined) in the inorganic insulating layer IIL. For example, the fourth crack dam CD4 may fill the seventh groove IILs7 and the eighth groove IILs8 formed (or defined) in the inorganic insulating layer IIL.

FIG. 8 illustrates that a crack dam CD fills two grooves IILs, but the disclosure is not limited thereto. Various modifications are possible, for example, a crack dam CD may fill a groove IILs, or a crack dam CD may fill three grooves IILs.

According to an embodiment, the functional layer 212/, the first inorganic layer 310, the second inorganic layer 330, the first touch insulating layer 410, the second touch insulating layer 420, the third touch insulating layer 440, and the planarization layer 460 may be disposed on each of the crack dams CD. Also, the functional layer 212/, the first inorganic layer 310, the second inorganic layer 330, the first touch insulating layer 410, the second touch insulating layer 420, the third touch insulating layer 440, and the planarization layer 460 may be disposed on the inorganic insulating layer IIL between the adjacent crack dams CD. However, the disclosure is not limited thereto. At least one of the functional layer 212/, the first inorganic layer 310, the second inorganic layer 330, the first touch insulating layer 410, the second touch insulating layer 420, the third touch insulating layer 440, and the planarization layer 460 disposed on each crack dam CD and inorganic insulating layer IIL may be omitted.

The first to eighth grooves IILs1 to IILs8 are formed (or defined) in the inorganic insulating layer IIL arranged in the intermediate area MA, and the first to fourth crack dams CD1 to DC4 are disposed on the inorganic insulating layer IIL while filling the first to eighth grooves IILs1 to IILs8 formed (or defined) in the inorganic insulating layer IIL, and thus transmission of the crack generated in the opening area OA and/or the intermediate area MA around the opening area OA to the display area DA may be prevented or reduced.

The first organic insulating layer 115 and the second organic insulating layer 116 may be arranged in the display area DA, whereas the first organic insulating layer 115 and the second organic insulating layer 116 may not be arranged in a partial area of the intermediate area MA. Accordingly, there may be a difference in levels between the display area DA and the intermediate area MA.

The planarization layer 460 may be arranged in the intermediate area MA. The planarization layer 460 may planarize the intermediate area MA. In other words, the planarization layer 460 may prevent or reduce the difference in levels between the display area DA and the intermediate area MA. The planarization layer 460 may be disposed on the third touch insulating layer 440. The planarization layer 460 may cover a structure therebelow.

Referring to the opening area OA of FIG. 8, the display panel 10 may include the opening 10OP. The opening 10OP of the display panel 10 may include openings of components included in the display panel 10. For example, the opening 10OP of the display panel 10 may include an opening 100OP of the substrate 100 and an opening 460OP of the planarization layer 460.

The openings of components included in the display panel 10 may be simultaneously formed. Accordingly, an inner side surface 100IS of the substrate 100 defining the opening 100OP of the substrate 100, and an inner side surface 460IS of the planarization layer 460 defining the opening 460OP of the planarization layer 460 may be arranged on a same vertical line.

There have been cases where visibility of the display panel 10 deteriorates due to layer separation or detachment occurred in layers arranged in the intermediate area MA with a cutting line of a laser process as a starting point. For example, in case that only a crack dam CD is arranged in the intermediate area MA, the visibility of the display panel 10 may deteriorate due to layer separation and detachment occurred in layers between the crack dams CD at the cutting line of the laser process.

According to the disclosure, the crack dams CD are provided in the intermediate area MA between the second dam DP2 and the opening area OA, and thus separation or detachment of layers arranged in the intermediate area MA may be prevented or reduced, thereby increasing the visibility of the display panel 10.

In a display panel according to embodiments, display elements may be prevented from being damaged by external impurities, such as moisture, based on an opening area, and separation or detachment of layers arranged in an intermediate area may be prevented or reduced.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display panel comprising:
an opening area;
a display area surrounding at least a part of the opening area;
an intermediate area between the opening area and the display area;
a light-emitting diode disposed on a substrate in the display area and including:
    a first electrode;
    a second electrode; and
    a functional layer between the first electrode and the second electrode;
a first dam disposed in the intermediate area;
a first crack dam located between the first dam and the opening area; and
a second crack dam located between the first crack dam and the opening area, wherein
the functional layer extends from the display area to the intermediate area,
the functional layer includes a first opening located between the first dam and the first crack dam; and
an inorganic insulating layer disposed on the substrate, wherein
the inorganic insulating layer includes at least one groove, and
the first crack dam fills the at least one groove included in the inorganic insulating layer.

2. The display panel of claim 1, wherein
each of the at least one groove is formed in a surface of the inorganic insulating layer that faces away from the substrate,
the inorganic insulating layer is disposed between the substrate and each of the first dam, the first crack dam, the second crack dam and the functional layer in a thickness direction of the display device.

3. The display panel of claim 1, wherein
the second crack dam fills the at least one groove included in the inorganic insulating layer, and
the inorganic insulating layer is disposed in both the display area and the intermediate area.

4. The display panel of claim 1, further comprising:
a third crack dam located between the second crack dam and the opening area, wherein
the first opening exposes an upper surface of the inorganic insulating layer that faces away from the substrate.

5. The display panel of claim 1, further comprising:
a second dam located between the first dam and the display area.

6. The display panel of claim 5, wherein the functional layer comprises:
a second opening located between the first dam and the second dam; and
a third opening located between the display area and the second dam, wherein
each of the second opening and the third opening exposes an upper surface of the inorganic insulating layer that faces away from the substrate.

7. The display panel of claim 5, further comprising:
a metal layer overlapping the first dam in a plan view, wherein each of first dam and the second dam is disposed between the metal layer and the substrate in a thickness direction of the display panel.

8. The display panel of claim 7, wherein
the metal layer at least partially overlaps a top surface of the first dam, a first side surface of the first dam adjacent to the second dam, and a second side surface of the first dam adjacent to the opening area in a plan view, and
the metal layer at least partially overlaps a top surface of the second dam, and a side surface of the second dam adjacent to the first dam in a plan view.

9. The display panel of claim 8, wherein
the metal layer includes an opening overlapping the top surface of the first dam in a plan view.

10. The display panel of claim 9, wherein the metal layer further includes a first metal layer and a second metal layer, wherein the first metal layer and the second metal layer at least partially overlap each other in a plan view.

11. The display panel of claim 7, further comprising:
a planarization layer disposed on the metal layer, wherein
the planarization layer is comprised of an organic insulating material,
the planarization layer planarizes an upper surface in the intermediate area, and
each of the first dam, the second dam, the first crack dam, and the second crack dam are disposed between the substrate and the planarization layer in a thickness direction of the display device.

12. The display panel of claim 11, further comprising:
a crack detection layer located between the display area and the second dam.

13. The display panel of claim 12, wherein the planarization layer covers the crack detection layer.

14. A display panel comprising:

an opening area;

a display area surrounding at least a part of the opening area;

an intermediate area between the opening area and the display area;

an inorganic insulating layer disposed on a substrate in both the intermediate area and the display area, wherein the inorganic insulating layer includes at least one groove;

a plurality of dams disposed on the inorganic intermediate layer and in the intermediate area;

a plurality of crack dams located between the plurality of dams and the opening area; and a metal layer at least partially overlapping the plurality of dams in a plan view.

15. The display panel of claim 14, wherein the plurality of crack dams include:

a first crack dam located between the display area and the opening area; and a second crack dam located between the first crack dam and the opening area, the plurality of dams include:

a first dam located between the display area and the first crack dam; and a second dam located between the display area and the first dam, and each of the first crack dam, the second crack dam, the first dam and the second dam comprises an organic insulating material.

16. The display panel of claim 15, wherein the at least one groove is formed in an upper surface of the inorganic insulating layer that faces away from the substrate, and the first crack dam fills the at least one groove included in the inorganic insulating layer.

17. The display panel of claim 16, wherein the second crack dam fills the at least one groove included in the inorganic insulating layer.

18. The display panel of claim 15, wherein the plurality of crack dams include a third crack dam located between the second crack dam and the opening area.

19. The display panel of claim 15, further comprising:

a light-emitting diode disposed in the display area and including:

a first electrode;

a second electrode; and a functional layer between the first electrode and the second electrode, wherein the functional layer extends from the display area to the intermediate area, and the functional layer includes a first opening located between the first dam and the first crack dam.

20. An electronic device comprising:

a display panel including:

an opening area;

a display area surrounding at least a part of the opening area; and an intermediate area between the opening area and the display area; and a component disposed on a bottom surface of the display panel and at least partially overlapping the opening area in a plan view, wherein the display panel comprises:

an inorganic insulating layer disposed on a substrate in both the display area and the intermediate area;

a plurality of dams disposed on an upper surface of the inorganic insulating layer and in the intermediate area;

a plurality of crack dams located between the plurality of dams and the opening area and on the inorganic insulating layer; and a metal layer at least partially overlapping each of the plurality of dams in a plan view, wherein each of the plurality of dams is disposed between the metal layer and the substrate in a thickness direction of the display panel.

* * * * *